US006993447B2

(12) United States Patent
Yamasaki

(10) Patent No.: US 6,993,447 B2
(45) Date of Patent: Jan. 31, 2006

(54) SYSTEM LSI

(75) Inventor: Yoshihiro Yamasaki, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 86 days.

(21) Appl. No.: 10/647,221

(22) Filed: Aug. 26, 2003

(65) Prior Publication Data
US 2005/0046434 A1 Mar. 3, 2005

(51) Int. Cl.
G01R 31/00 (2006.01)
G01R 31/26 (2006.01)

(52) U.S. Cl. .................. 702/118; 702/120; 324/765

(58) Field of Classification Search .................. 702/57, 702/58, 81–84, 108, 117–121, 123–125, 182–183; 257/203, 207, 208; 324/500, 527
See application file for complete search history.

(56) References Cited

U.S. PATENT DOCUMENTS

| 4,255,672 A | * | 3/1981 | Ohno et al. ................ 326/47 |
| 5,072,274 A | * | 12/1991 | Kokado ...................... 257/565 |
| 5,489,538 A | * | 2/1996 | Rostoker et al. ............. 438/15 |
| 6,043,672 A | * | 3/2000 | Sugasawara ................ 324/765 |

* cited by examiner

Primary Examiner—Marc S. Hoff
Assistant Examiner—Manuel L. Barbee
(74) Attorney, Agent, or Firm—Volentine Francos & Whitt

(57) ABSTRACT

A system LSI includes a plurality of circuit blocks; a first power supply terminal, which is connected to a first circuit block; and a second power supply terminal, which is connected to a second circuit block. A first level of test voltage is applied from the first power supply terminal to the first circuit block for a predetermined period of time whereby the first circuit block is tested in operation. A second level of test voltage is applied from the second power supply terminal to the second circuit block for a predetermined period of time whereby the second circuit block is tested in operation independently from the first circuit block.

6 Claims, 5 Drawing Sheets

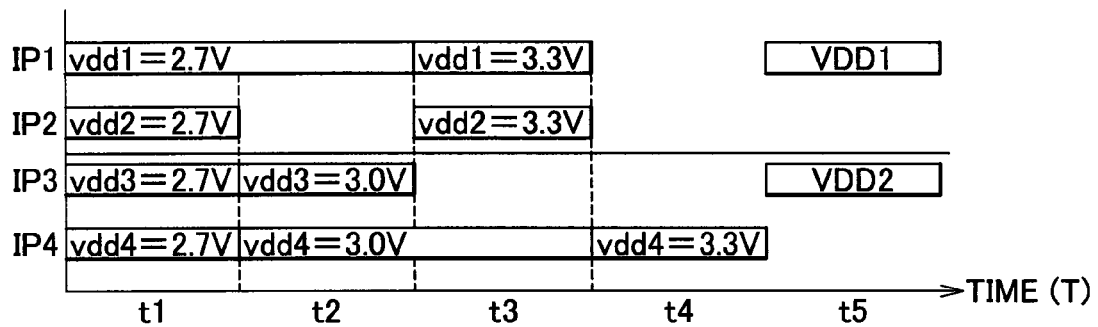
F I G. 2

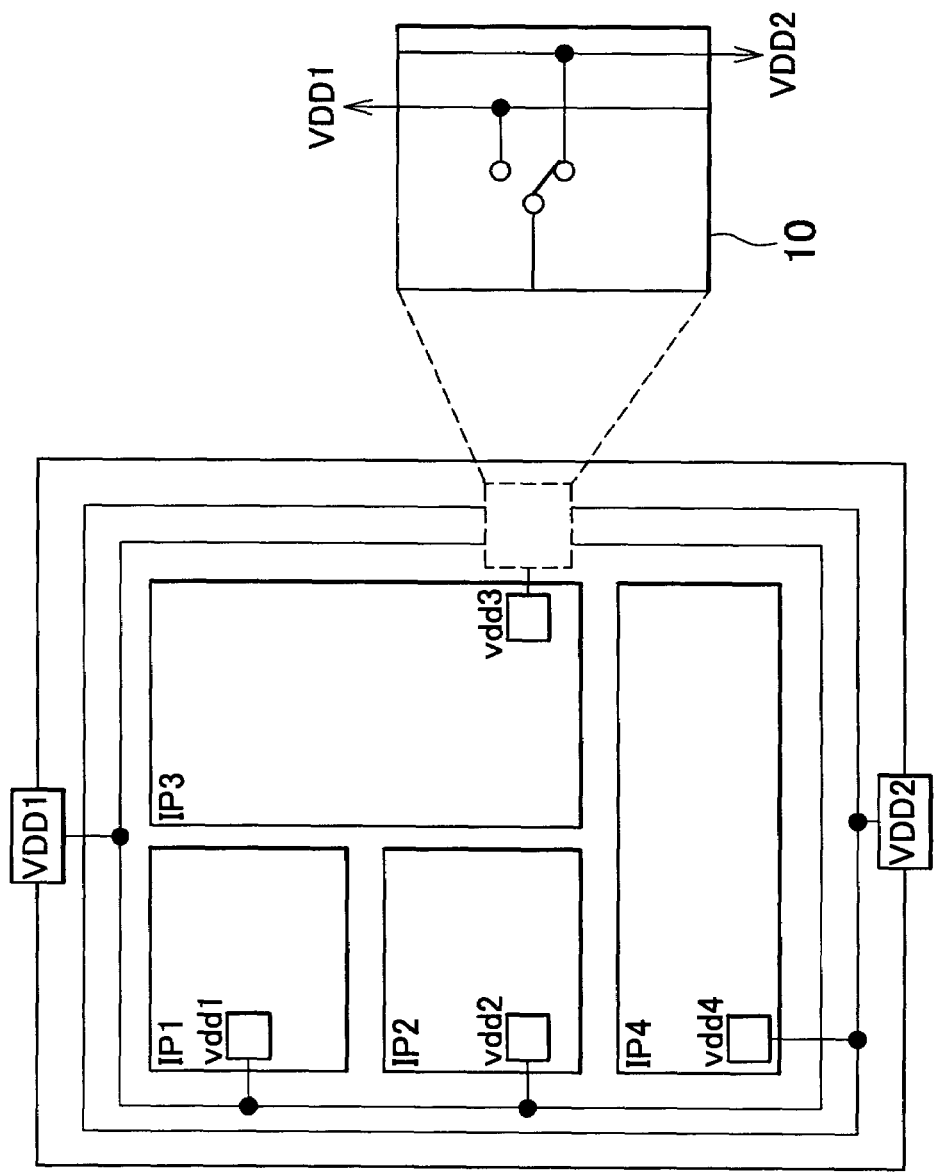

SYSTEM LSI

TECHNICAL FIELD OF THE INVENTION

The present invention relates to a system large scale integration including a plurality of circuit blocks. More particularly, the present invention relates to a system LSI designed to perform a test operation of circuit blocks for a shorter period of time.

BACKGROUND OF THE INVENTION

A conventional system LSI includes a plurality of circuit blocks and a single power supply terminal, connected to the circuit blocks. Each circuit block may be tested with different levels of supply voltage and different durations of tests. The total duration of tests is determined based on the longest duration of test for a specific circuit block. In other words, some circuit blocks may not be tested until the longest duration of test is completed.

OBJECTS OF THE INVENTION

Accordingly, it is an object of the present invention to provide a system LSI in which circuit blocks can be tested for a shorter period of time.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to the present invention, a system LSI includes a plurality of circuit blocks; a first power supply terminal, which is connected to a first circuit block; and a second power supply terminal, which is connected to a second circuit block. A first level of test voltage is applied from the first power supply terminal to the first circuit block for a predetermined period of time whereby the first circuit block is tested in operation. A second level of test voltage is applied from the second power supply terminal to the second circuit block for a predetermined period of time whereby the second circuit block is tested in operation independently from the first circuit block. The circuit blocks can be tested for a shorter period of time.

BRIEF DESCRIPTION OF THE DRAWINGS

FIG. 2 is a timing chart showing the test operation of the system LSI according to the first preferred embodiment, shown in FIG. 1.

FIG. 3 is a circuit (block) diagram showing a system LSI according to a second preferred embodiment of the present invention.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
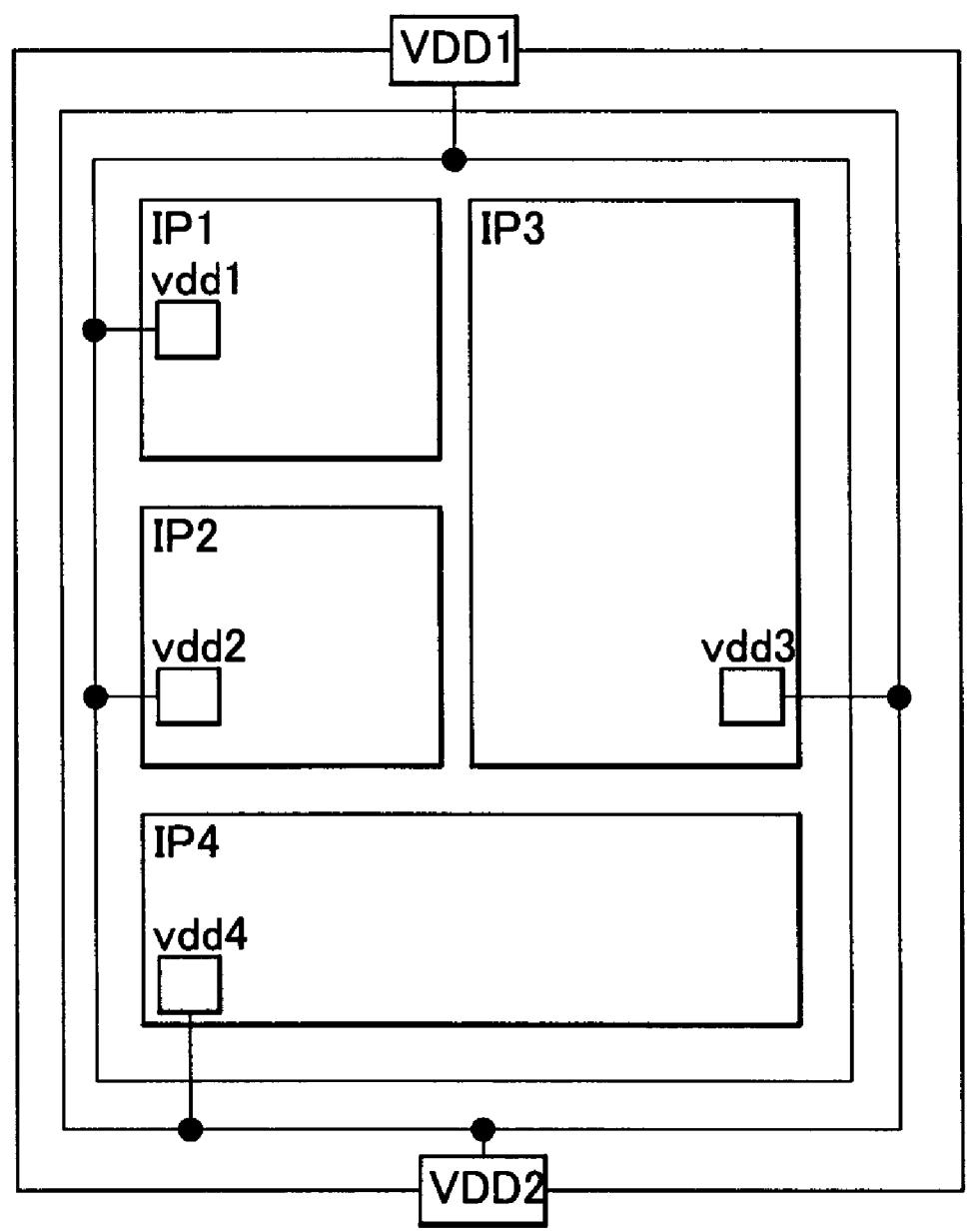
FIG. 1 is a circuit (block) diagram showing a system LSI according to a first preferred embodiment of the present invention.

FIG. 1 is a circuit (block) diagram showing a system LSI on a wafer according to a first preferred embodiment of the present invention. The system LSI includes a plurality of circuit blocks IP1, IP2, IP3 and IP4; a first power supply terminal VDD1; and a second power supply terminal VDD2. The first power supply terminal VDD1 is connected to the circuit blocks IP1 and IP2. The second power supply terminal VDD2 is connected to the circuit blocks IP3 and IP4. All of the circuit blocks are tested on a wafer before fabrication of the system LSI is completed. The circuit blocks IP1 to IP4 may be a logic circuit, an analog circuit, a memory circuit, and so on.

FIG. 2 is a timing chart showing the test operation of the system LSI according to the first preferred embodiment, shown in FIG. 1. In test operation, during a period of time "t1", a 2.7V of test signal is applied from the first power supply terminal VDD1 to the circuit blocks IP1 and IP2. At the same time, a 2.7V of test signal is applied from the second power supply terminal VDD2 to the circuit blocks IP3 and IP4.

During a period of time "t2", 2.7V of test signal maintains being applied from the first power supply terminal VDD1 to the circuit block IP1, but no test signal is applied to the circuit block IP2. On the other hand, a 3.0V of test signal is applied from the second power supply terminal VDD2 to the circuit blocks IP3 and IP4.

During a period of time "t3", a 3.3V of test signal is applied from the first power supply terminal VDD1 to the circuit blocks IP1 and IP2. On the other hand, 3.0V of test signal maintains being applied from the second power supply terminal VDD2 to the circuit block IP4, but not test signal is applied to the circuit block IP3.

During a period of time "t4", a 3.3V of test signal is applied from the second power supply terminal VDD2 to the circuit blocks IP4. On the other hand, no test signal is applied to the circuit blocks IP1, IP2 and IP3.

As described above, according to the first preferred embodiment, the total duration of test is "t1+t2+t3+t4".

FIG. 3 is a circuit (block) diagram showing a system LSI according to a second preferred embodiment of the present invention. The system LSI includes a plurality of circuit blocks IP1, IP2, IP3 and IP4; a first power supply terminal VDD1; a second power supply terminal VDD2; and a switching circuit (relay circuit) 10. The first power supply terminal VDD1 is connected to the circuit blocks IP1 and IP2 and to the switching circuit 10. The second power supply terminal VDD2 is connected to the circuit block IP4 and the switching circuit 10. The circuit block IP3 is connected to the switching circuit 10. All of the circuit blocks are tested on a wafer before fabrication of the system LSI is completed. The circuit blocks IP1 to IP4 may be a logic circuit, an analog circuit, a memory circuit, and so on.

The switching circuit 10 selectively connects the circuit block IP3 to the first and second power supply terminals VDD1 and VDD2.

Figure 4A:
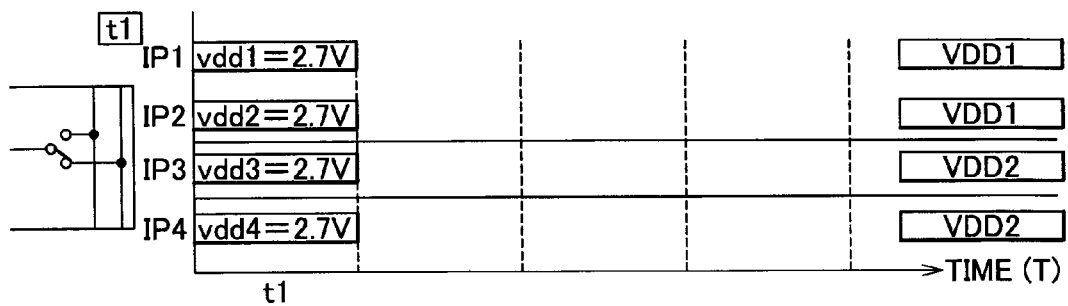
FIGS. 4A to 4C are timing charts showing the test operation of the system LSI according to the second preferred embodiment, shown in FIG. 3.
Figure 4B:
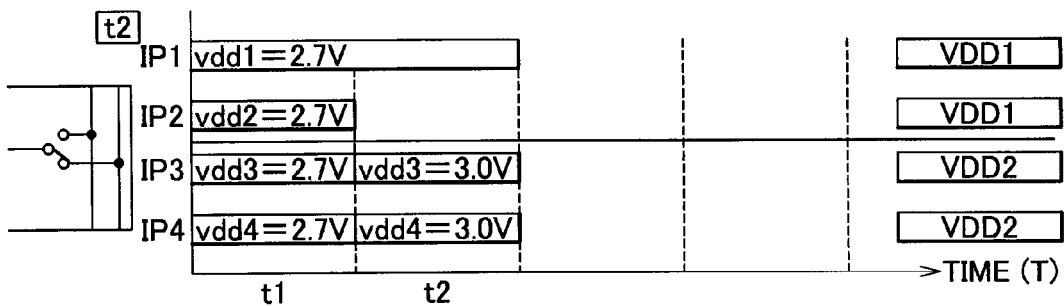
Figure 4C:
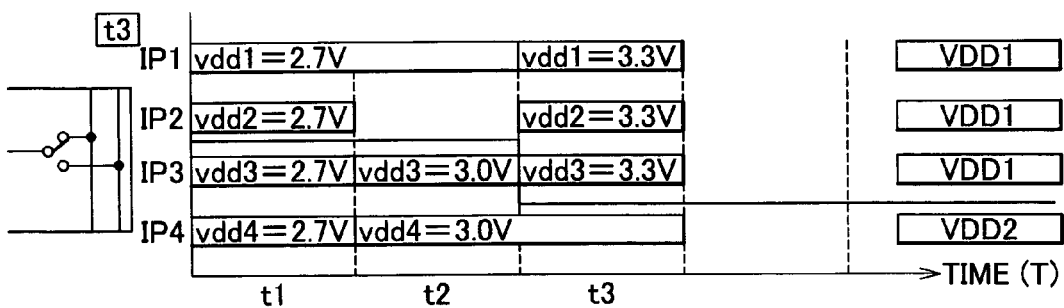

FIGS. 4A to 4C are timing charts showing the test operation of the system LSI according to the second preferred embodiment, shown in FIG. 3. In test operation, during a period of time "t1", the switching circuit 10 connects the circuit block IP3 to the second power supply terminal VDD2. A 2.7V of test signal is applied from the first power supply terminal VDD1 to the circuit blocks IP1 and IP2, and a 2.7V of test signal is applied from the second power supply terminal VDD2 to the circuit blocks IP3 and IP4.

During a period of time "t2", the switching circuit 10 keep connecting the circuit block IP3 to the second power supply terminal VDD2. 2.7V of test signal maintains being applied from the first power supply terminal VDD1 to the circuit blocks IP1, but not IP2. On the other hand, a 3.0V of test signal is applied from the second power supply terminal VDD2 to the circuit blocks IP3 and IP4.

During a period of time "t3", the switching circuit 10 connects the circuit block IP3 to the first power supply terminal VDD1. A 3.3V of test signal is applied from the first power supply terminal VDD1 to the circuit blocks IP1, IP2 and IP3. On the other hand, 3.0V test signal maintains being applied from the second power supply terminal to the circuit block IP4.

As described above, according to the second preferred embodiment, the total duration of test is "t1+t2+t3".

Figure 5A:
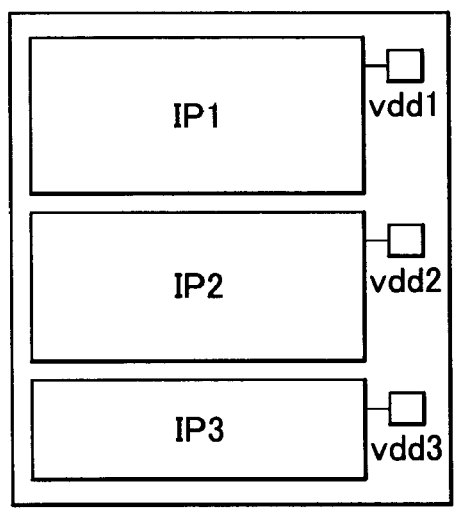
FIGS. 5A and 5B are circuit (block) diagrams showing a system LSI according to a third preferred embodiment of the present invention.
Figure 5B:
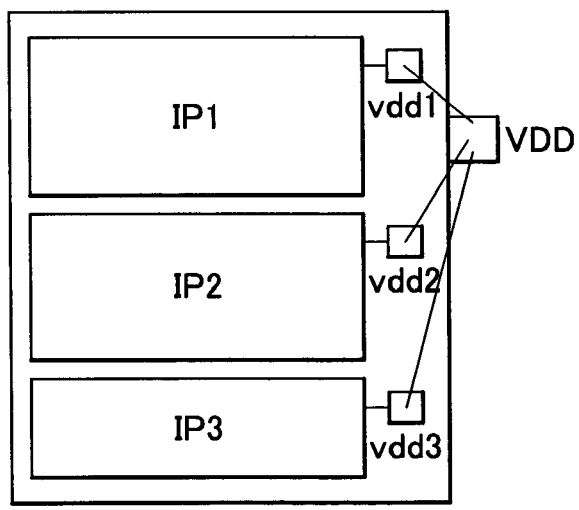

FIGS. 5A and 5B are circuit (block) diagrams showing a system LSI according to a third embodiment of the present invention. The system LSI includes a plurality of circuit blocks IP1, 1P2 and 1P3, which are connected to first to third terminals vdd1, vdd2 and vdd3, respectively. All of the circuit blocks IP1 to 1P3 are tested on a wafer before fabrication of the system LSI is completed. The circuit blocks IP1 to IP3 may be a logic circuit, an analog circuit, a memory circuit, and so on. FIG. 5A illustrates the configuration on a wafer.

For testing the operation of the circuit blocks IP1 to IP3, test voltage signals are applied to the terminals vdd1, vdd2 and vdd3 independently. After such an operation test, the terminals vdd1, vdd2 and vdd3 are wire-bonded to an external power supply terminal VDD, as shown in FIG. 5B. FIG. 5B illustrates the configuration as a complete system LSI.

As described above, according to the third preferred embodiment, the total duration of test becomes shorter as compared with the conventional technology. Since the circuit blocks IP1 to 1P3 are tested individually and independently on the wafer, the total duration is determined based on the longest test period for a specific circuit block, IP1, 1P2 or 1P3.

What is claimed is:

1. A system large scale integration (LSI), comprising:
   first, second and third circuit blocks, each circuit block being located on a wafer;
   a first power supply terminal located on the wafer and supplied with a first power supply voltage for test, wherein the first power supply voltage has a first voltage level and has a second voltage level which is different from the first voltage level;
   a first power supply line located on the wafer, which surrounds the first, second and third circuit blocks, and which is connected to the first power supply terminal and the first and second circuit blocks;
   a second power supply terminal located on the wafer and supplied with a second power supply voltage for test, wherein the second power supply voltage has the first voltage level and has a third voltage level which is different from the first and second voltage levels; and
   a second power supply line located on the wafer, which surrounds the first, second and third circuit blocks, and which is connected to the second power supply terminal and the third circuit block.

2. A system LSI according to claim 1, wherein the first and second circuit blocks are tested on the wafer before fabrication of the system LSI is completed.

3. A system LSI according to claim 1, further comprising:
   a switching circuit, connected to the second circuit block and the first and second power supply lines, that couples either one of the first and second power supply lines to the second circuit block.

4. A system LSI according to claim 3, wherein the first power supply line is surrounded by the second power supply line.

5. A system LSI according to claim 1, wherein the first power supply line is surrounded by the second power supply line.

6. A system LSI according to claim 5, wherein the first, second and third circuit blocks are tested on the wafer before fabrication of the system LSI is completed.

* * * * *